(12) United States Patent
Owens et al.

(10) Patent No.: US 6,909,316 B2
(45) Date of Patent: Jun. 21, 2005

(54) VARIABLE DELAY CIRCUIT WITH HIGH RESOLUTION

(75) Inventors: Ronnie E. Owens, Fort Collins, CO (US); Barbara J. Duffner, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/371,091

(22) Filed: Feb. 21, 2003

(65) Prior Publication Data

US 2004/0164780 A1 Aug. 26, 2004

(51) Int. Cl.[7] .............................. H03K 5/13; H03M 1/66
(52) U.S. Cl. ....................... 327/266; 327/274; 327/231; 341/136
(58) Field of Search .............................. 327/2, 12, 156, 327/158, 276, 231, 237, 266, 274; 341/136, 144

(56) References Cited

U.S. PATENT DOCUMENTS 5,554,945 A * 9/1996 Lee et al. ................... 327/105
5,748,125 A * 5/1998 Cederbaum et al. ........ 341/136
6,369,627 B1 * 4/2002 Tomita ....................... 327/158

* cited by examiner

Primary Examiner—Dinh T. Le

(57) ABSTRACT

Variable delay circuits and methods for delaying a waveform by an adjustable time delay are disclosed herein. One such variable delay circuit comprises a delay range limitation circuit having a first differential input, a first differential output, and a second differential output. The first differential input is configured to receive an input waveform. The first differential output is configured to output the waveform with a maximum delay, and the second differential output is configured to output the waveform with a minimum delay. The variable delay circuit further comprises a delay mixing circuit having second and third differential inputs, first and second control inputs, and a third differential output. The second differential input is connected to the first differential output. The third differential input is connected to the second differential output. The first and second control inputs are configured to receive control voltages V1 and V2, which are related to a selected time delay. The differential output is configured to output the waveform with the selected time delay.

6 Claims, 4 Drawing Sheets

VARIABLE DELAY CIRCUIT WITH HIGH RESOLUTION

TECHNICAL FIELD

This disclosure generally relates to delay circuits. More particularly, the disclosure relates to circuits and methods for delaying an input waveform by a time period that is varied with high resolution.

BACKGROUND

In the design of digital and analog electrical circuits, oftentimes it is necessary to delay a signal or multiple signals by a predetermined time period in order to account for the additional time that is required for other related signals to propagate through a portion of a circuit. In order to match these times and to provide simultaneous input and/or output of various signals into or out of the circuit, delay circuits are added, as needed, to properly match the related signals in time. In analog circuits, delay circuits typically delay the starting time of an analog waveform. In digital circuits, delay circuits typically adjust the phase of digital signals by delaying the rising and/or falling edges of the digital pulses.

One type of delay circuit is the variable delay circuit, which is used to provide an adjustable time delay to the propagating signals. Variable delay circuits are needed when the relative time offset between signals is not always consistent. In this situation, the time delays apportioned to the various signals can be adjusted accordingly to maintain consistent time offsets or synchronization, whichever the particular case may be.

Variable delay circuits may be used, for example, in an integrated circuit (IC) tester containing a waveform generator. In an IC tester, the waveform generator generates a waveform, which may consist of a group of test signals. The test signals are applied to an IC under test and the output signals from the IC are measured to determine whether or not the IC provides an acceptable output response. Since the waveform generator of the IC tester supplies various signals to different inputs of the IC, it is important that the test signals are applied within a specific time period. If the test signals are applied inaccurately, due to improper timing or delay circuits, poor test results may be incorrectly attributed to a fault in the IC. For this reason, variable delay circuits can provide more accurate timing delays for test signals of a waveform generator in an IC tester.

Many conventional variable delay circuits, however, may be configured with capacitance circuits for adjusting the delay. With a capacitance circuit, these conventional variable delay circuits will typically control the negative-going pulse but not the positive-going pulse. As a result, a phenomenon known as pulse-width modulation (PWM) will result. If an attempt is made to create a higher resolution variable delay circuit in which a plurality of these conventional circuits are placed in series, the problem of PWM arises such that the pulse width is diminished by each stage until it is totally eliminated when too many of these circuits are connected in series. Thus, the number of delay circuits that can be connected in series, and therefore the resolution, is limited.

Also, in delay circuits having capacitance elements, a finer resolution typically cannot be achieved because of the nature of the capacitance elements. The time delay resolution is usually limited by the smallest MOSFET element that can be fabricated in the circuit.

Conventional delay circuits may also suffer from additional noise in the circuit because they typically contain current sources that tend to vary. Therefore, with additional noise, the consistency and accuracy of the delay provided by conventional variable delay circuits deteriorates. Thus, a need exists in the industry to address the aforementioned and/or other perceived deficiencies and inadequacies.

SUMMARY

Disclosed herein are variable delay circuits and methods for delaying an input waveform by a variable time delay. One embodiment of a variable delay circuit comprises a delay range limitation circuit that has a first differential input, a first differential output, and a second differential output. The first differential input is configured to receive an input waveform. The first differential output is configured to output the waveform with a maximum delay and the second differential output is configured to output the waveform with a minimum delay. This variable delay circuit further comprises a delay mixing circuit that has second and third differential inputs, first and second control inputs, and a third differential output. The second differential input is connected to the first differential output and the third differential input is connected to the second differential output. The first and second control inputs are configured to receive analog control voltages that are indicative of a selected time delay. The differential output is configured to output the waveform with the selected time delay.

An example of a method for delaying an input waveform by a variable time delay comprises the operation of establishing a minimum short delay and a maximum long delay. The method includes selecting a delay between the minimum short delay and the maximum long delay. When an input waveform is received, the method includes delaying the input waveform by a time period based on the selected delay.

Other systems, methods, features, and advantages will be apparent to one having skill in the art upon examination of the following drawings and detailed description. It is intended that all such additional systems, methods, features, and advantages be included within this description and protected by the accompanying claims.

BRIEF DESCRIPTION OF THE DRAWINGS

Many aspects of the embodiments disclosed herein can be better understood with reference to the following drawings. Like reference numerals designate corresponding parts throughout the several views.

DETAILED DESCRIPTION

Described herein are embodiments of variable delay circuits and methods that provide a time delay to a waveform or signal. The variable delay circuits are capable of providing a consistent and repeatable time delay. They may be used with a variety of other circuits in which a variable, or adjustable, delay is needed. For example, the variable delay circuits may be used in a waveform generator of an integrated circuit tester.

Figure 1:
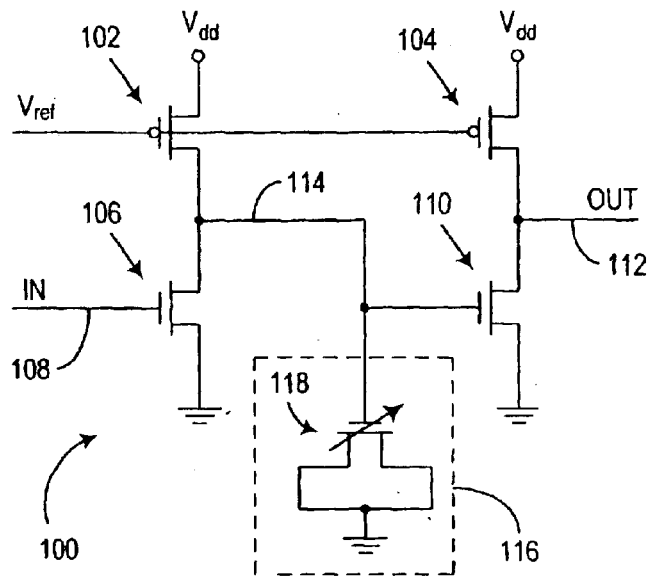
FIG. 1 is a schematic diagram of a first embodiment of a variable delay circuit.

FIG. 1 is a schematic diagram of an embodiment of a variable delay circuit 100 that applies a time delay on a waveform propagating through the variable delay circuit 100. A reference voltage $V_{ref}$ is applied to the gate of a metal-oxide-semiconductor field effect transistor (MOSFET) 102 and to the gate of another MOSFET 104. The MOSFETs 102 and 104 are preferably p-type, or p-channel, MOSFETs, but may alternatively be substituted with n-type MOSFETs, as is well known in the art. The drain contacts of the MOSFETs 102 and 104 are connected to a supply voltage $V_{dd}$.

The source contact of MOSFET 102 is connected to the source contact of a MOSFET 106, which is preferably an n-type, or n-channel, MOSFET. The gate contact of the n-type MOSFET 106 is connected to an input terminal 108 that receives an incoming waveform. The source contact of MOSFET 104 is connected to the source contact of a second n-type MOSFET 110 at a node that is further coupled to an output terminal 1112. The drain contacts of the n-type MOSFETs 106 and 110 are connected to ground. The connection between the source contacts of the MOSFETs 102 and 106 is coupled to the gate contact of MOSFET 110 along line 114.

The variable delay circuit 100 further contains a variable capacitance circuit 116, which may be configured in a number of different ways. In the embodiment shown in FIG. 1, the variable capacitance circuit 116 contains a variable n-type MOSFET 118. The variable n-type MOSFET 118 has its gate contact connected to line 114 and its source and drain contacts are connected to ground.

The operation of the variable delay circuit 100 involves adjusting the variable n-type MOSFET 118 of the variable capacitance circuit 116. The capacitance value of the variable capacitance circuit 116 sets the time delay that a waveform experiences while propagating through the variable delay circuit 100. A signal that is sent along the input terminal 108 is delayed by the set time related to the capacitance value of the variable capacitance circuit 116. After the delay, the signal leaves the output terminal 112 at the output of the variable delay circuit 100.

Figure 2:
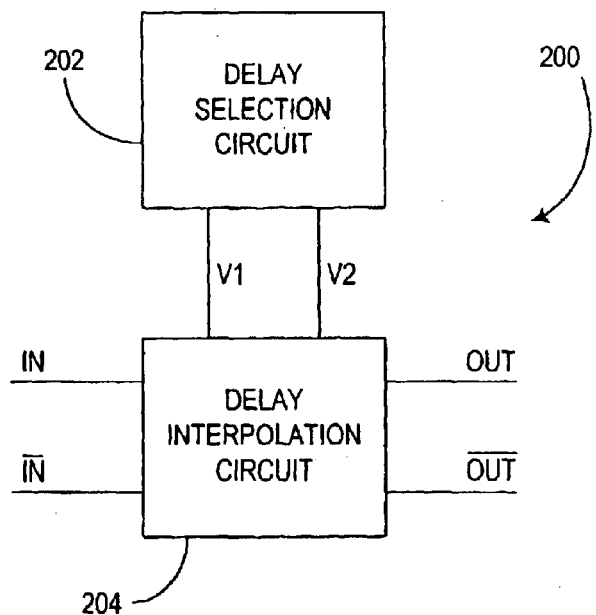
FIG. 2 is a block diagram of a second embodiment of a variable delay circuit.

FIG. 2 is a block diagram of an embodiment of a high-resolution variable delay circuit 200 that imposes a time delay on a waveform propagating through it. The term "high-resolution" is used herein to describe the manner in which the time delay can be established. With the variable delay circuit 200, the delay can be selected to a high degree of resolution and can be set with great accuracy. The design of the embodiment of FIG. 2 includes a variable delay circuit with a differential configuration. The differential variable delay circuit does not suffer from many of the problems that analog variable delay circuits experience.

For instance, the variable delay circuit 200 does not typically experience pulse-width modulation (PWM), which is commonly created by conventional variable delay circuits having capacitance circuits. In these conventional variable delay circuits, the negative-going pulse is controlled, but the positive-going pulse typically is not, thus resulting in PWM. To create a higher resolution variable delay circuit, these conventional circuits are placed in series. However, with the problem of PWM, the pulse width can be totally eliminated if too many of these circuits are connected in series. Thus, the number of delay circuits that can be connected in series, and therefore the resolution, is limited.

A second advantage of the variable delay circuit 200 over conventional variable delay circuits is that the time delay resolution can be determined by a number of digital input elements. The design can easily be varied to include any number of digital input elements, depending on the desired application. However, the time delay resolution of other variable delay, circuits having capacitance elements is usually limited by the smallest MOSFET element that can be fabricated.

A third advantage that the variable delay circuit 200 has over conventional delay circuits is that it contains a substantially constant current source, which adds very little noise. Since conventional variable delay circuits have power supplies with a tendency to vary, additional supply noise is generated. As a result, the accuracy of conventional variable delay circuits is reduced.

The variable delay circuit 200 contains a delay selection circuit 202 and a delay interpolation circuit 204. The delay selection circuit 202 includes output terminals that provide control voltages V1 and V2 to the delay interpolation circuit 204. The control voltages V1 and V2 represent respective proportions of a maximum long delay and a minimum short delay that are mixed together to form an intermediate time delay. The delay interpolation circuit 204 contains a differential input configured to receive a differential waveform along the input terminals IN and $\overline{\text{IN}}$. The delayed waveform exits the delay interpolation circuit 204, i.e., the output of the variable delay circuit 200, along the differential output terminals OUT and $\overline{\text{OUT}}$.

Generally, the operation of the variable delay circuit 200 includes selecting a desired delay from within established limits and setting the time delay according to the desired delay. The delay selection circuit 202 selects the time delay that is imposed on the propagating waveform. The delay is selected from a range that is established by the delay interpolation circuit 204. The range includes a minimum delay, a maximum delay, and intermediate delays between the minimum and maximum delays. Furthermore, the resolution of the intermediate delays is dictated by the number of digital elements contained within the delay selection circuit 202, as described in more detail below. The delay interpolation circuit 204 receives control voltages V1 and V2 and interpolates the delay between the minimum delay and the maximum delay. The interpolation is a weighted interpolation based on the values of control voltages V1 and V2.

The differential inputs IN and $\overline{\text{IN}}$ to the variable delay circuit 200 are complements of each other and are therefore matched. For this reason, it is possible to achieve better resolution than can be achieved by conventional variable delay circuits. Moreover, the variable delay circuit 200 operates with a current source that is constant, even when the voltages V1 and V2 change or even during transition. Therefore, with constant current, very little noise is attributed to the power supply.

Figure 3:
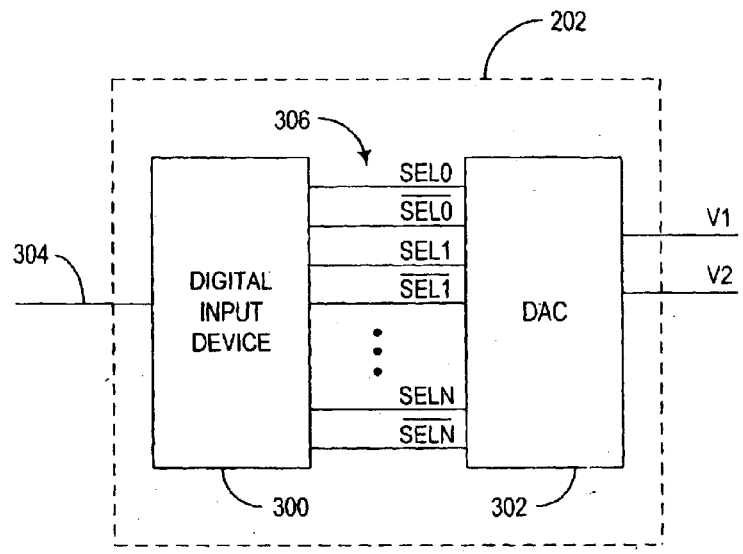
FIG. 3 is a block diagram of the embodiment of the delay selection circuit shown in FIG. 2.

FIG. 3 is a block diagram of the embodiment of the delay selection circuit 202 shown in FIG. 2. The embodiment of FIG. 3 contains a digital input device 300 and a digital-to-analog converter (DAC) 302. The digital input device 300 contains an input terminal 304 that is configured to receive a request for a desired time delay. The input terminal 304 may receive the time delay request from a user who wishes to input a desired delay or alternatively may receive the time delay request from a device that automatically supplies a desired time delay in accordance with an output response of an output waveform. The input terminal 304 may be connected to other suitable calibration or selection mechanisms that provide a desired time delay. In another alternative, the digital input device 300 may be replaced with a user input device that provides a digital representation of a selected time delay.

The output of the digital input device 300 is connected to the DAC 302 along select lines 306. The select lines 306 are configured as complementary pairs of digital inputs, labeled SEL0, $\overline{SEL0}$, SEL1, $\overline{SEL1}$, ..., SELN, and $\overline{SELN}$. With (N+1) pairs of select lines 306, any digital value from 0 to $2^{(N+1)}$ may be present. The pairs of select lines 306 are considered to be complementary since each select input SELx represents a true digital bit and each select input $\overline{SELx}$ represents its digital complement. Thus, if a select input SEL0 is a logic high, $\overline{SEL0}$ is a logic low, and so on.

Based on the desired time delay received on the input terminal 304, the digital input device 300 sends a number (N+1) of pairs of complementary select bits to the DAC 302, which converts the digital value of the select bits into analog control voltages V1 and V2. The control voltages V1 and V2 are applied from the DAC 302, i.e., the output of the delay selection circuit 202, to the delay interpolation circuit 204 (FIG. 2).

The digital input device 300 may contain any digital device such as a computer, microprocessor, digital memory device, etc. Preferably, the digital input device 300 contains a look-up table, or other suitable memory component, that outputs pre-calibrated select bit combinations corresponding to desired time delays. For example, if a specific time delay is requested on input terminal 304, the digital input device 300 correlates the desired delay with the pre-calibrated select bits, i.e., the selection outputs SEL0, $\overline{SEL0}$, SEL1, $\overline{SEL1}$, ..., SELN, and $\overline{SELN}$.

The pre-calibrated select bits may be determined beforehand during a calibration process in which the select bits along SEL0, $\overline{SEL0}$, SEL1, $\overline{SEL1}$, SELN, and $\overline{SELN}$ are systematically changed through the range of possible combinations and the resulting time delay is measured. The corresponding inputs and outputs can be stored together in a look-up table. Alternatively, the digital input device 300 may calculate a formula that defines this input/output relationship. Other suitable memory devices or components can be used alternatively to correlate the desired time delays received on input terminal 304 with the required select bit outputs required to achieve the desired delay. Therefore, to repeat a desired time delay, the digital input device 300 supplies the appropriate selection outputs to the DAC 302.

Figure 4:
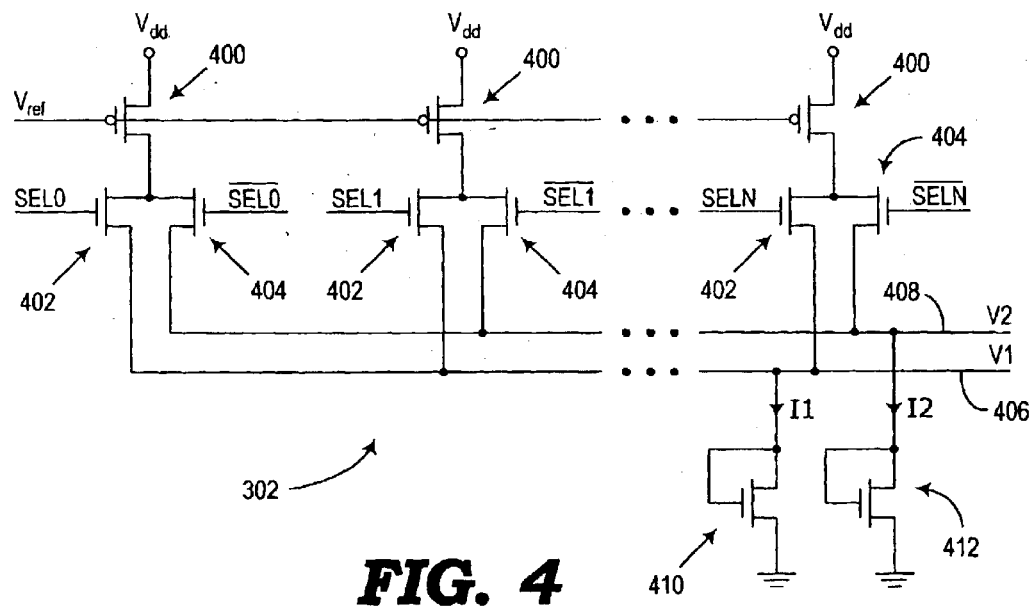
FIG. 4 is a schematic diagram of the embodiment of the digital-to-analog converter (DAC) shown in FIG. 3.

FIG. 4 is a schematic diagram of the embodiment of the DAC 302 shown in FIG. 3. The DAC 302, as illustrated in this embodiment, contains a number (N+1) of p-type MOSFETs 400. The MOSFETs 400 have drain contacts connected to supply voltage $V_{dd}$ and gate contacts connected to reference voltage $V_{ref}$. The voltage $V_{ref}$ is generated in a controlled manner such that it is substantially constant. Thus, any sensitivity that the variable delay circuit 200 may have to power supply changes is reduced. Furthermore, the MOSFETs 400 and the voltages $V_{dd}$ and $V_{ref}$ are configured such that the currents flowing through the MOSFETs 400 are constant and binary weighted. For example, by being binary weighted, the currents through the MOSFETs 400 have a relationship such that the first MOSFET 400 provides a current I, the second MOSFET 400 provides a current 2*I, the third MOSFET 400 provides a current 4*I, the fourth provides a current 8*I, etc. The last MOSFET 400 therefore provides a current $2^N*I$.

The DAC 302 of FIG. 4 further contains a number (N+1) of n-type MOSFETs 402. The gate contacts of the MOSFETs 402 receive the true select input bits SEL0, SEL1, ..., SELN, respectively, from the digital input device 300. The DAC 302 further contains a number (N+1) of n-type MOSFETs 404. The gate contacts of the MOSFETs 404 receive the complementary select input bits $\overline{SEL0}$, $\overline{SEL1}$, ..., $\overline{SELN}$, respectively, from the digital input device 300. The input bits are considered to be complementary since a logic high input at an ith true select input will be a logic low on the ith complementary select input, and vice versa, where i=0 to N.

The source contact of each of the (N+1) p-type MOSFETs 400 is connected to the source contacts of the corresponding (N+1) n-type MOSFETs 402 and 404. Each of the complementary pairs of MOSFETs 402 and 404, receiving select inputs SELx and $\overline{SELx}$, is connected to receive a respective one of the binary weighted currents I, 2*I, 4*I, ... $2^N*I$. The resolution of the time delay depends on the number (N+1), which represents the number of complementary pairs of MOSFETs 402 and 404 and corresponding MOSFET 400. For example, if N=7 (eight complementary pairs), then the binary weighted currents range from I to 128*I.

The DAC 302 of FIG. 4 is further configured such that the drain contacts of the MOSFETs 402 that receive the true select bits are tied together and connected to an output terminal 406 that supplies the first control voltage V1. The drain contacts of the MOSFETs 404 that receive the complementary select bits are tied together and connected to another output terminal 408 that supplies the second control voltage V2. The output terminal 406 is connected to voltage pull-up circuit 410, which may contain a MOSFET having the source and gate contacts tied together and the drain contact connected to ground. The voltage pull-up circuit 410 completes a voltage divider configuration and boosts the control voltage V1 by a predetermined amount. A similar voltage pull-up circuit 412 is connected to the output terminal 408. Likewise, the voltage pull-up circuit 412 completes a voltage divider configuration and boosts the control voltage V2 by a predetermined amount.

The (N+1) MOSFETs 402 and 404 are basically transfer gates that transfer the weighted currents I, 2*I, 4*I, ..., $2^N*I$ to the voltage pull-up circuits 410, 412 to produce the voltages V1 and V2. The voltages V1 and V2 vary with the square root of the currents I1 and I2 through the MOSFETs of the voltage pull-up circuits 410 and 412. A current I1 through voltage pull-up circuit 410 is the sum of all the currents through the selected true bit MOSFETs 402. In the above example in which N=7, I1 can range from 0 to 255*I. A current I2 is the sum of all the currents through the selected complementary bit MOSFETs 404. With N=7, I2 ranges from 0 to 255*I and is equal to 255*I minus I1. Generally, the relationship of the currents I1 and I2 is defined by the equation: $I1+I2=(2^{(N+1)}-1)*I$, where I is the lowest of the binary weighted currents.

To more clearly explain the complementary digital inputs into the DAC 302, the following example is given. In the example in which N=7, assume that true bits 0, 1, and 7 are selected, or given a logic one, and complementary bits 2, 3, 4, 5, and 6 are selected. Therefore, the complementary bits 0, 1, and 7 and true bits 2, 3, 4, 5, and 6 are logic zero. The accumulative current I1 will be I+2*I+128*I, which equals 131*I. Also, the accumulative current I2 will be 4*I+8*I+16*I+32*I+64*I, which equals 124*I. Since I1 is slightly higher than I2, a slightly higher voltage V1 at the output terminal 406 will be created compared to the voltage V2 on output terminal 408. Thus, with a slightly higher V1, the delay will be interpolated a little more heavily on the side of the long delay.

Figure 5:
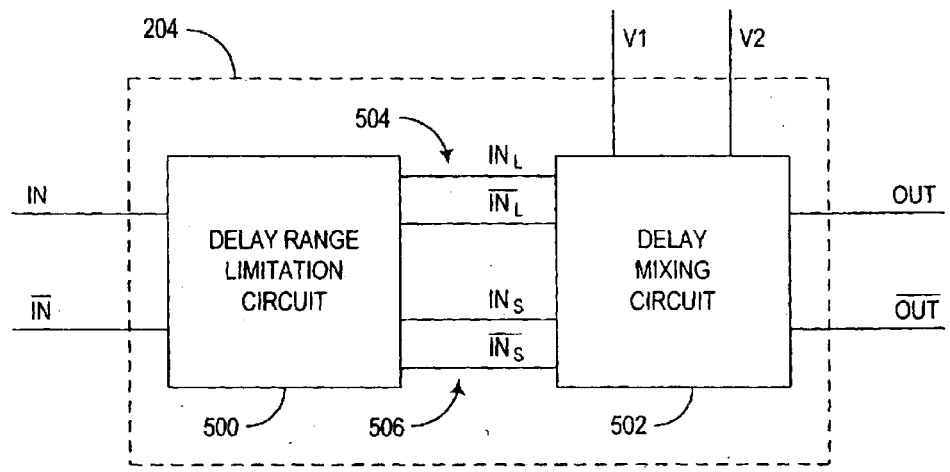
FIG. 5 is a block diagram of the embodiment of the delay interpolation circuit shown in FIG. 2.

FIG. 5 is a block diagram of the embodiment of the delay interpolation circuit 204 shown in FIG. 2. The embodiment of FIG. 5 contains a delay range limitation circuit 500 and a delay mixing circuit 502. The delay range limitation circuit 500 receives at its input, i.e., the input to the delay interpolation circuit 204, the input waveform along the differential input lines IN and $\overline{\text{IN}}$. The delay range limitation circuit 500 is connected to the delay mixing circuit 502 by two differential paths. The first differential path is a long delay differential branch 504, which carries the input waveform $IN_L$ and $\overline{IN}_L$ delayed by a long delay. The second differential path is a short delay differential branch 506, which carries the input waveform $IN_S$ and $\overline{IN}_S$ delayed by a short delay.

The delay range limitation circuit 500 defines a range of time delays by providing a minimum time delay and a maximum time delay. The minimum time delay represents the shortest delay that the input waveform may experience in the variable delay circuit 200. The maximum time delay represents the longest delay that the input waveform may experience in the variable delay circuit 200. Within the entire range of time delays defined by the delay range limitation circuit 500, a selected time delay is established by interpolating between the minimum time delay and maximum time delay.

Based on the maximum time delay (long delay) from the long delay differential branch 504 and the minimum time delay (short delay) from the short delay differential branch 506, the delay mixing circuit 502 mixes a combination of the long delayed waveform and short delayed waveform according to the control voltages V1 and V2. The control voltage V1 determines the proportion of the long delay and the control voltage V2 determines the proportion of the short delay. These proportions determine the weighted amounts that the time delay is interpolated using the minimum short delay and the maximum long delay as the extreme limits.

The delay mixing circuit 502 receives the two versions of the input waveform, the first version delayed by a long delay along the long delay differential branch 504 and the second version delayed by a short delay along the short delay differential branch 506. In addition to these input terminals, the delay mixing circuit 502 also includes terminals that receive control voltages V1 and V2 from the delay selection circuit 202 (FIG. 2). The delay mixing circuit 502 further contains differential output terminals OUT and $\overline{\text{OUT}}$ that provide the output waveform delayed by the selected time period, as represented by the weighted interpolation values of V1 and V2.

Figure 6:
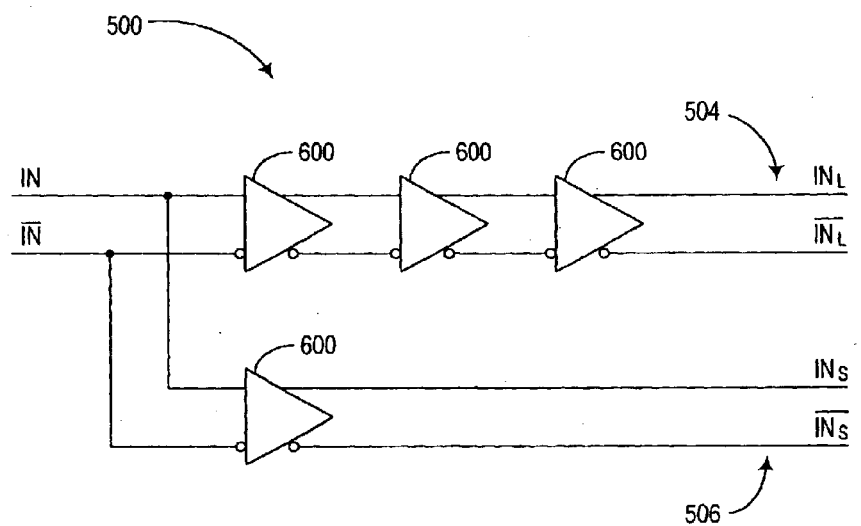
FIG. 6 is a schematic diagram of the embodiment of the delay range limitation circuit shown in FIG. 5.

FIG. 6 is a schematic diagram of the embodiment of the delay range limitation circuit 500 shown in FIG. 5. The embodiment of FIG. 6 contains input terminals IN and $\overline{\text{IN}}$, as mentioned earlier, for receiving the differential input waveform. The output of the delay range limitation circuit 500 contains the long delay differential branch 504, having outputs $IN_L$ and $\overline{IN}_L$, and the short delay differential branch 506, having outputs $IN_S$ and $\overline{IN}_S$. The delay range limitation circuit 500 further contains a number of delay elements 600. The embodiment of FIG. 6 illustrates the delay elements 600 as differential amplifiers. However, the delay elements 600 may consist of any kind, or even different kinds, of well known differential elements used for delaying a waveform.

The long delay differential branch 504 is illustrated having three delay elements 600. However, it should be noted that any number of delay elements 600 can be placed in the long delay differential branch 504 in order to achieve a desirable maximum time delay. Therefore, the number of delay elements 600 may be chosen such that the long delay differential branch 504 provides the longest time delay that is to be made available using the variable delay circuit 200. One of ordinary skill in the art, equipped with the knowledge gained from the present disclosure, will understand that the design of the long delay differential branch 504 can be changed to achieve any desirable maximum time delay.

The short delay differential branch 506 is shown with only one delay element 600. However, the number of delay elements 600 may be any number, even zero, to achieve a desirable minimum time delay. Preferably, the number of delay elements 600 in the short delay differential branch 506 is less than the number in the long delay differential branch 504. If different types of delay elements 600 are used, the different delay elements 600 are preferably selected such that the long delay differential branch 504 has a longer delay than the delay of the short delay differential branch 506.

The operation of the exemplary delay range limitation circuit 500 of FIG. 6 is now explained. By providing a certain number of delay elements 600 in the long delay differential branch 504, a maximum time delay is established. Likewise, by providing a certain number of delay elements 600 in the short delay differential branch 504, a minimum time delay is established. The minimum time delay and maximum time delay define the limits or boundary within which the variable delay circuit 200 operates. The time delay is confined to this range, unless the delay range limitation circuit 500 is altered by changing the short delay differential branch 506 and/or the long delay differential branch 504. Within the established range, an intermediate time delay may be selected to the degree or resolution based on the number of pairs of complementary select inputs, as described above with respect to FIG. 4.

Figure 7:
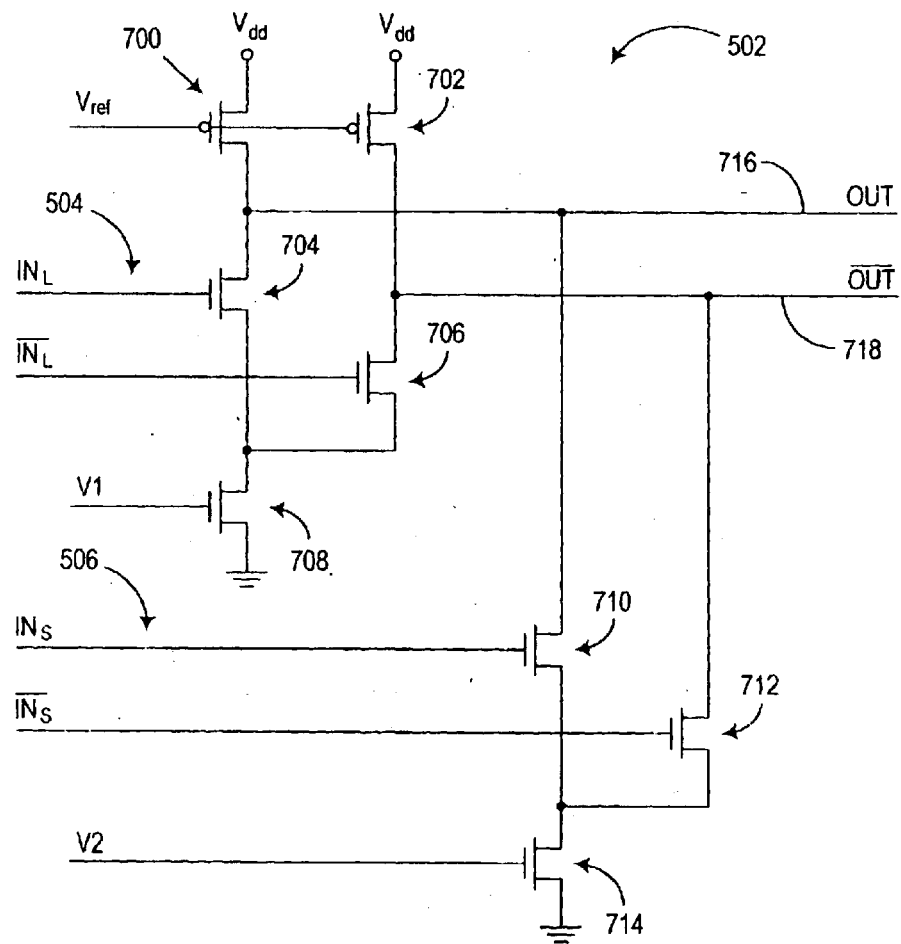
FIG. 7 is a schematic diagram of the embodiment of the delay mixing circuit shown in FIG. 5.

FIG. 7 is a schematic circuit diagram of an exemplary embodiment of the delay mixing circuit 502 shown in FIG. 5. The delay mixing circuit 502, in accordance with this embodiment, comprises p-type load MOSFETs 700 and 702 that have their drain contacts connected to supply voltage $V_{dd}$ and their gate contacts connected to reference voltage $V_{ref}$. For example, the reference voltage $V_{ref}$ may be equal to the reference voltage $V_{ref}$ from FIG. 4. The delay mixing circuit 502 further contains n-type MOSFETs 704, 706, 708, 710, 712, and 714, each having gate contacts configured to receive inputs from the delay range limitation circuit 500 (FIG. 5) or the delay selection circuit 202 (FIG. 2). The MOSFETs 708 and 714 act as current sources that generate currents that vary with the square of the gate voltages, i.e., control voltages V1 and V2, respectively.

MOSFETs 704 and 706 receive the long delay differential input waveform $IN_L$ and $\overline{IN}_L$, respectively, along the long delay differential branch 504 from the delay range limitation circuit 500 (FIG. 5). MOSFET 704 has its gate contact connected to the $IN_L$ input and MOSFET 706 has its gate contact connected to the $\overline{IN}_L$ input. MOSFET 708 receives at its gate contact the control voltage V1 from the delay selection circuit 202 (FIG. 2). The source contact of the MOSFET 708 is connected to the drain contacts of MOSFETs 704 and 706. The drain contact of MOSFET 708 is connected to ground. The MOSFETs 704, 706, and 708, in conjunction with the respective p-type MOSFETs 700 and 702, form current source differential buffers.

MOSFETs 710 and 712 receive the short delay differential input waveform $IN_S$ and $\overline{IN}_S$, respectively, along the short delay differential branch 506 from the delay range limitation circuit 500 (FIG. 5). MOSFET 710 has its gate contact connected to the $IN_S$ input and MOSFET 712 has its gate contact connected to the $\overline{IN}_S$ input. MOSFET 714 receives at its gate contact the control voltage V2 from the delay selection circuit 202 (FIG. 2). The source contact of the MOSFET 714 is connected to the drain contacts of MOSFETs 710 and 712. The drain contact of MOSFET 714 is connected to ground. The MOSFETs 710, 712, and 714, in conjunction with the respective p-type MOSFETs 700 and 702, also form current source differential buffers.

The source contact of MOSFET 704 is connected to the source contact of MOSFET 700 at a node that is coupled to output terminal 716. Likewise, the source contact of MOSFET 710 is connected to the same node coupled to output terminal 716. Based on the control voltage V1 at MOSFET 708, current is allowed to flow through MOSFET 704 by a proportional amount. Based on the waveform along line $IN_L$, a portion of the waveform, proportional to the control voltage V1, develops at an output along the output terminal 716. In the same manner, the voltage V2 at MOSFET 714 determines the proportional amount of current that is allowed to flow through MOSFET 710. Based on the waveform along the $IN_S$, a portion of the waveform, proportional to the control voltage V2, develops on the node connected to output terminal 716. At this node, the proportions of the $IN_L$ and $IN_S$ waveforms developed across MOSFETs 704 and 710, respectively, are added together to provide a summed output. The summed output include the proportion of the long delayed waveform based on V1 and the proportion of the short delayed waveform based on V2.

In a similar manner, a complementary output waveform $\overline{OUT}$ is output from a complementary output terminal 718. The source contact of MOSFET 706 is connected to the source contact of MOSFET 702 at a node that is coupled to output terminal 718. Likewise, the source contact of MOSFET 712 is connected to the same node coupled to output terminal 718. Based on the control voltage V1 at MOSFET 708, current is allowed to flow through MOSFET 706 by a proportional amount. Based on the waveform along line $\overline{IN}_L$, a portion of the waveform, proportional to the control voltage V1, develops at the node connected to the output terminal 718. Based on the voltage V2 at MOSFET 714, current is allowed to flow through MOSFET 712 by a proportional amount. Based on the waveform along line $\overline{IN}_S$, a portion of the waveform, proportional to the control voltage V2, develops at the node connected to the output terminal 718. At this node, the proportions of the $\overline{IN}_L$ and $\overline{IN}_S$ waveforms developed across MOSFETs 706 and 712, respectively, are added together to provide a summed output. The summed output includes the proportion of the long delayed waveform based on V1 and the proportion of the short delayed waveform based on V2.

Examples of the operation of the variable delay circuit 200 will now be given. In one example, the control voltages V1 and V2 may be established such that they are substantially equal. In this case, about 50% of the short delay and 50% of the long delay will be mixed together. Therefore, the output terminals 716 and 718 will output a differential waveform that is delayed by a time delay equal to an average between the long delay and short delay.

In an extreme example to provide the longest possible delay, the voltage V2 is equal to zero and the voltage V1 is equal to a maximum voltage. In this example, the maximum V1 is present at MOSFET 708. The currents through MOSFETs 700 and 702 flow exclusively through MOSFETs 704 and 706 and do not flow through MOSFETs 710 and 712. With V2 equal to zero, substantially no current flows through MOSFET 714, which, in turn, results in no current through MOSFETs 710 and 712. Therefore, only the long delayed version of the waveform is connected to the output terminals 716 and 718.

In the other extreme situation in which the shortest possible delay is selected, V1 is set to zero and V2 is set to a maximum voltage. In this situation, the maximum voltage is present at MOSFET 714 and no voltage is present at MOSFET 708. Current flows through MOSFETs 710 and 712 to produce a waveform at the output terminals 716 and 718 that is delayed by the shortest possible delay. Intermediate values of V1 and V2 may be provided as well, limited only by the resolution established by the number of select bits received by the DAC 302. Therefore, a high-resolution time delay, ranging from an established minimum short delay to an established maximum long delay, may be selected.

It should be emphasized that the above-described embodiments are merely examples of possible implementations. Many variations and modifications may be made to the above-described embodiments. All such modifications and variations are intended to be included herein within the scope of this disclosure and protected by the following claims.

We claimed:

1. A variable delay circuit comprising:
   a delay selection circuit comprising:
      a digital input device having a number (N+1) of pairs of complementary select outputs; and
      a digital-to-analog converter (DAC) having (N+1) pairs of inputs connected to the (N+1) pairs of complementary select outputs of the digital input device, the DAC further comprising outputs that provide control voltages V1 and V2; and
   a delay interpolation circuit having inputs that receive the control voltages V1 and V2 from the DAC, the delay interpolation circuit further comprising:
      a delay range limitation circuit having a differential waveform input that receives a differential waveform, the delay range limitation circuit having first and second differential output branches, the first differential output branch having a long time delay and the second differential output branch having a short time delay; and
      a delay mixing circuit having control inputs, differential inputs, and a differential output, the differential inputs connected to the first and second differential output branches, the control inputs configured to receive the control voltages V1 and V2;
   wherein the DAC further comprises:
      (N+1) binary weighted current source p-type MOSFETs;
      (N+1) complementary pairs of selection MOSFETs, each complementary pair of selection MOSFETs connected to a respective one of the (N+1) binary weighted current source p-type MOSFETs, each complementary pair of selection MOSFETs comprising a true bit MOSFET and a complementary bit MOSFET;
      a first control voltage terminal connected to the true bit MOSFETs of the complementary pairs of selection MOSFETs, the first control voltage terminal providing the control voltage V1; and
      a second control voltage terminal connected to the complementary bit MOSFETs of the complementary pairs of selection MOSFETs, the second control voltage terminal providing the control voltage V2.

2. The variable delay circuit of claim 1, wherein:
the first differential output branch comprises a first number of delay elements representing a maximum delay; and
the second differential output branch comprises a second number of delay elements representing a minimum delay, the first number being greater than the second number.

3. The variable delay circuit of claim 1, wherein the delay mixing circuit comprises:
first and second p-type MOSFETs having gate contacts connected to a reference voltage $V_{ref}$;
a first n-type MOSFET connected to the first p-type MOSFET at a first node, the first node connected to a first output terminal OUT;
a second n-type MOSFET connected to the second p-type MOSFET at a second node, the second node connected to a second output terminal $\overline{OUT}$;
a third n-type MOSFET connected to the first and second n-type MOSFETs;
a fourth n-type MOSFET connected to the first p-type MOSFET at the first node;
a fifth n-type MOSFET connected to the second p-type MOSFET at the second node; and
a sixth n-type MOSFET connected to the fourth and fifth n-type MOSFETs;
wherein the first and second n-type MOSFETs are connected to the first differential output branch, the third n-type MOSFET is configured to receive the control voltage V1, the fourth and fifth n-type MOSFETs are connected to the second differential output branch, and the sixth n-type MOSFET is configured to receive the control voltage V2.

4. A variable delay circuit comprising:
a delay range limitation circuit having a first differential input, a first differential output, and a second differential output, the first differential input configured to receive an input waveform, the first differential output configured to output the waveform with a maximum delay, and the second differential output configured to output the waveform with a minimum delay;
a delay mixing circuit having second and third differential inputs, first and second control inputs, and a third differential output, the second differential input connected to the first differential output, the third differential input connected to the second differential output, the first and second control inputs configured to receive control voltages V1 and V2 related to a selected time delay, and the differential output configured to output the waveform with the selected time delay; and
a delay selection circuit configured to output said control voltages V1 and V2, the delay selection circuit comprising:
a digital input device configured to provide pairs of complementary selection bits; and
a digital-to-analog converter (DAC) configured to receive the pairs of complementary selection bits and to output said control voltages V1 and V2;
wherein the digital input device comprises a look-up table.

5. The variable delay circuit of claim 4, wherein the DAC comprises:
a number (N+1) of true bit MOSFETs, each true bit MOSFET configured to receive a respective binary weighted current;
a number (N+1) of complementary bit MOSFETs, each complementary bit MOSFET configured to receive the respective binary weighted current received by a corresponding true bit MOSFET;
a first voltage pull-up circuit connected to the (N+1) true bit MOSFETs, the first voltage pull-up circuit configured to provide said control voltage V1;
a second voltage pull-up circuit connected to the (N+1) complementary bit MOSFETs, the second voltage pull-up circuit configured to provide said control voltage V2.

6. The variable delay circuit of claim 4, wherein the delay mixing circuit comprises:
first and second p-type MOSFETs having gate contacts connected to a reference voltage $V_{ref}$;
a first n-type MOSFET connected to the first p-type MOSFET at a first node, the first node connected to a first output terminal OUT;
a second n-type MOSFET connected to the second p-type MOSFET at a second node, the second node connected to a second output terminal $\overline{OUT}$;
a third n-type MOSFET connected to the first and second n-type MOSFETs;
a fourth n-type MOSFET connected to the first p-type MOSFET at the first node;
a fifth n-type MOSFET connected to the second p-type MOSFET at the second node; and
a sixth n-type MOSFET connected to the fourth and fifth n-type MOSFETs.

* * * * *